(12) United States Patent
Moon et al.

(10) Patent No.: US 9,431,071 B2
(45) Date of Patent: Aug. 30, 2016

(54) BIT-LINE SENSE AMPLIFIER CAPABLE OF COMPENSATING MISMATCH BETWEEN TRANSISTORS, AND SEMICONDUCTOR MEMORY DEVICE INCLUDING THE SAME

(71) Applicant: Samsung Electronics Co., Ltd., Suwon-si (KR)

(72) Inventors: Jong-Ho Moon, Hwaseong-si (KR); Tai-Young Ko, Seongnam-si (KR); Hyung-Sik You, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/658,353

(22) Filed: Mar. 16, 2015

(65) Prior Publication Data

US 2016/0012868 A1 Jan. 14, 2016

(30) Foreign Application Priority Data

Jul. 9, 2014 (KR) .................. 10-2014-0086183

(51) Int. Cl.
| | | |
|---|---|---|
| G11C 7/00 | (2006.01) | |
| G11C 7/06 | (2006.01) | |
| G11C 11/4091 | (2006.01) | |
| G11C 7/12 | (2006.01) | |

(52) U.S. Cl.
CPC ........... *G11C 7/065* (2013.01); *G11C 11/4091* (2013.01); *G11C 7/12* (2013.01)

(58) Field of Classification Search
CPC ................................. G11C 7/065; G11C 7/12
See application file for complete search history.

(56) References Cited

U.S. PATENT DOCUMENTS

| | | | |
|---|---|---|---|
| 4,858,195 A | 8/1989 | Soneda | |
| 5,544,110 A * | 8/1996 | Yuh ........................ | G11C 7/065 327/55 |
| 6,466,501 B2 | 10/2002 | Kim et al. | |
| 7,209,399 B2 | 4/2007 | Chun et al. | |
| 8,233,343 B2 | 7/2012 | Moon | |
| 2004/0165418 A1* | 8/2004 | Lesea .................. | G11C 11/4125 365/154 |
| 2007/0076501 A1* | 4/2007 | Kang ...................... | G11C 7/02 365/208 |

FOREIGN PATENT DOCUMENTS

| | | |
|---|---|---|
| KR | 1995-0012021 | 10/1995 |
| KR | 10-2007-0079244 A | 8/2007 |
| KR | 10-2007-0084781 A | 8/2007 |
| KR | 10-2010-0100132 A | 9/2010 |
| KR | 10-2011-0001411 A | 1/2011 |

* cited by examiner

*Primary Examiner* — Richard Elms
*Assistant Examiner* — Mohammed A Bashar
(74) *Attorney, Agent, or Firm* — Muir Patent Law, PLLC

(57) ABSTRACT

A bit-line sense amplifier may include a pull-up driving circuit, a pull-down driving circuit and a latch-type sense amplifier. The pull-up driving circuit including a plurality of PMOS transistors connected between a power supply voltage line and a first driving power supply line, and may be configured to provide a first driving current on the first driving power supply line in response to an up control signal. The pull-down driving circuit may be configured to provide a second driving current on a second driving power supply line in response to a down control signal. The latch-type sense amplifier may be connected between the first driving power supply line and the second driving power supply line, and may be configured to sense and amplify a voltage difference between a bit line and a complementary bit line.

19 Claims, 15 Drawing Sheets

BIT-LINE SENSE AMPLIFIER CAPABLE OF COMPENSATING MISMATCH BETWEEN TRANSISTORS, AND SEMICONDUCTOR MEMORY DEVICE INCLUDING THE SAME

CROSS-REFERENCE TO RELATED APPLICATION

This application claims priority under 35 U.S.C. §119 to Korean Patent Application No. 10-2014-0086183 filed on Jul. 9, 2014, the disclosure of which is hereby incorporated by reference in its entirety.

BACKGROUND

1. Field

The present disclosure relates to a bit-line sense amplifier and a semiconductor memory device including the bit-line sense amplifier.

2. Description of Related Art

Semiconductor memory devices are widely used in various electronic products and applications. In certain semiconductor memory devices, each memory cell is located at an intersecting point of a bit-line and a word-line, a bit-line sense amplifier is coupled to the bit-lines to sense and amplify a voltage of the memory cell, and a sub-word-line driving circuit for generating word-line driving signals is coupled to the word-lines. The bit-line sense amplifier senses and amplifies a voltage difference between the bit lines.

As semiconductor memory devices have been highly integrated, operating characteristics of the bit-line sense amplifier including many transistors may depend on a performance of the transistors. Accordingly, various technologies for obtaining a transistor that may stably operate in process variation are being developed.

SUMMARY

Example embodiments of the inventive concept provide a bit-line sense amplifier capable of compensating mismatch of transistors.

Other example embodiments of the inventive concept provide a semiconductor memory device including the bit-line sense amplifier.

In accordance with an aspect of the inventive concept, a bit-line sense amplifier may include a pull-up driving circuit, a pull-down driving circuit and a latch-type sense amplifier.

The pull-up driving circuit includes a plurality of PMOS transistors connected between a power supply voltage line and a first driving power supply line, and is configured to provide a first driving current on the first driving power supply line in response to an up control signal. The pull-down driving circuit is configured to provide a second driving current on a second driving power supply line in response to bits of a down control signal. The latch-type sense amplifier is connected between the first driving power supply line and the second driving power supply line, and is configured to sense and amplify a voltage difference between a bit line and a complementary bit line.

In one embodiment, the latch-type sense amplifier may include a first inverter that includes a first PMOS transistor and a first NMOS transistor, wherein a gate of each of the first PMOS transistor and the first NMOS transistor is connected to the complementary bit line, and a second inverter that includes a second PMOS transistor and a second NMOS transistor, wherein a gate of each of the second PMOS transistor and the second NMOS transistor is connected to the bit line.

In one embodiment, the latch-type sense amplifier may be configured to output a threshold voltage of the first inverter as a voltage of the bit line, and to output a threshold voltage of the second inverter as a voltage of the complementary bit line.

In one embodiment, the latch-type sense amplifier may further include a first switch, a second switch, a third switch and a fourth switch.

The first switch may be configured to electrically connect an output terminal of the first inverter to an input terminal of the first inverter in response to a first control signal. The second switch may be configured to electrically connect an output terminal of the second inverter to an input terminal of the second inverter in response to the first control signal. The third switch may be configured to electrically connect the output terminal of the first inverter to the bit line in response to a second control signal. The fourth switch may be configured to electrically connect the output terminal of the second inverter to the complementary bit line in response to the second control signal.

In one embodiment, when the first driving current or the second driving current is changed, threshold voltages of the first PMOS transistor and the first NMOS transistor comprising the first inverter may be changed.

In one embodiment, when the first driving current or the second driving current is changed, threshold voltages of the second PMOS transistor and the second NMOS transistor comprising the second inverter may be changed.

In one embodiment, the pull-down driving circuit may include a plurality of NMOS transistors connected between the second driving power supply line and a ground voltage line. An amount of the second driving current may be configured to be changeable according to the number of the NMOS transistors that may be operated in response to bits of the down control signal.

In one embodiment, the pull-down driving circuit may include a first driving circuit configured to generate a gate driving signal in response to the down control signal, and a second driving circuit configured to provide the second driving current on the second driving power supply line in response to the gate driving signal. An amount of the second driving current may be configured to be changeable according to a voltage level of the gate driving signal.

In accordance with an aspect of the inventive concept, a bit-line sense amplifier may include a pull-up driving circuit, a pull-down driving circuit and a latch-type sense amplifier.

The pull-up driving circuit is connected between a power supply voltage line and a first driving power supply line, and is configured to provide a first driving current on the first driving power supply line in response to an up control signal. The pull-down driving circuit is configured to provide a second driving current on a second driving power supply line in response to a gate driving signal and a down control signal. The latch-type sense amplifier is connected between the first driving power supply line and the second driving power supply line, and senses and amplifies a voltage difference between a bit line and a complementary bit line. A voltage level of a logic high level of the gate driving signal is changeable based on a reference voltage, a power supply voltage on the power supply voltage line, and the down control signal.

In one embodiment, the pull-up driving circuit may include a plurality of PMOS transistors connected between the power supply voltage line and the first driving power supply line, and the PMOS transistors may be configured to operate in response to bits of the up control signal.

In one embodiment, the pull-down driving circuit may include a voltage adjusting circuit configured to regulate the power supply voltage in response to the reference voltage, and may generate a first voltage on a first node; a first driving circuit configured to generate the gate driving signal based on bits of the down control signal and the first voltage; and a second driving circuit configured to provide the second driving current on the second driving power supply line in response to the bits of the gate driving signal.

In one embodiment, the voltage adjusting circuit may include a differential amplifier having an inverted input terminal to which the reference voltage is applied, and a non-inverted input terminal connected to the first node; and a PMOS transistor having a gate connected to an output terminal of the differential amplifier, a source connected to the power supply voltage line, and a drain connected to the first node.

In one embodiment, the first driving circuit may include a plurality of inverters connected between the first node and a ground voltage line, and may be configured to generate the bits of the gate driving signal in response to the bits of the down control signal.

In one embodiment, the second driving circuit may include a plurality of NMOS transistors connected between a ground voltage line and the second driving power supply line, and the NMOS transistors may be configured to operate in response to the bits of the gate driving signal.

In one embodiment, the first driving circuit may include one inverter connected between the first node and the ground voltage line, and may be configured to generate the gate driving signal in response to the down control signal.

In one embodiment, the second driving circuit may include one NMOS transistor connected between the ground voltage line and the second driving power supply line, and the NMOS transistor may be configured to operate in response to the gate driving signal.

In accordance with an aspect of the inventive concept, a semiconductor memory device may include a first bit line, a second bit line, and a bit-line sense amplifier. The bit-line sense amplifier is connected between the first bit line and the second bit line, and includes a pull-up driving circuit connected between a power supply voltage line and a first driving power line, and configured to provide a pull-up current on the first driving power line in response to a pull-up control signal; a pull-down driving circuit connected between a second driving power line and a ground voltage line, and configured to provide a pull-down current on the second driving power line in response to a first driving signal; and a latch-type sense amplifier connected between the first driving power line and the second driving power line, and configured to sense and amplify a voltage difference between the first bit line and the second bit line. A value of a logic high level of the first driving signal is changeable based on a reference voltage.

In accordance with an aspect of the inventive concept, a semiconductor memory device may include a memory cell array, an address input buffer, a row decoder, a column decoder, an input/output (I/O) sense amplifier, and an output circuit.

The memory cell array includes word lines, bit lines, memory cells arranged at intersecting points of the word lines and the bit lines, and a bit-line sense amplifier that amplifies a voltage difference between two of the bit lines, and operates in response to a word line enable signal and a column select signal. The address input buffer generates a row address signal and a column address signal based on an external address. The row decoder decodes the row address signal to generate the word line signal. The column decoder decodes the column address signal to generate the column select signal. The I/O sense amplifier amplifies data output from the memory cell array to generate a first data, and transfers data received from the outside to the memory cell array. The output circuit generates output data based on the first data. The bit-line sense amplifier may include a pull-up driving circuit, a pull-down driving circuit and a latch-type sense amplifier. The pull-up driving circuit includes a plurality of PMOS transistors connected between a power supply voltage line and a first driving power supply line, and provides a first driving current on first driving power supply line in response to bits of an up control signal. The pull-down driving circuit provides a second driving current on a second driving power supply line in response to a down control signal. The latch-type sense amplifier is connected between the first driving power supply line and the second driving power supply line, and senses and amplifies a voltage difference between a bit line and a complementary bit line.

BRIEF DESCRIPTION OF THE DRAWINGS

The foregoing and other features and advantages of the inventive concept will be apparent from the more particular description of various embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1:
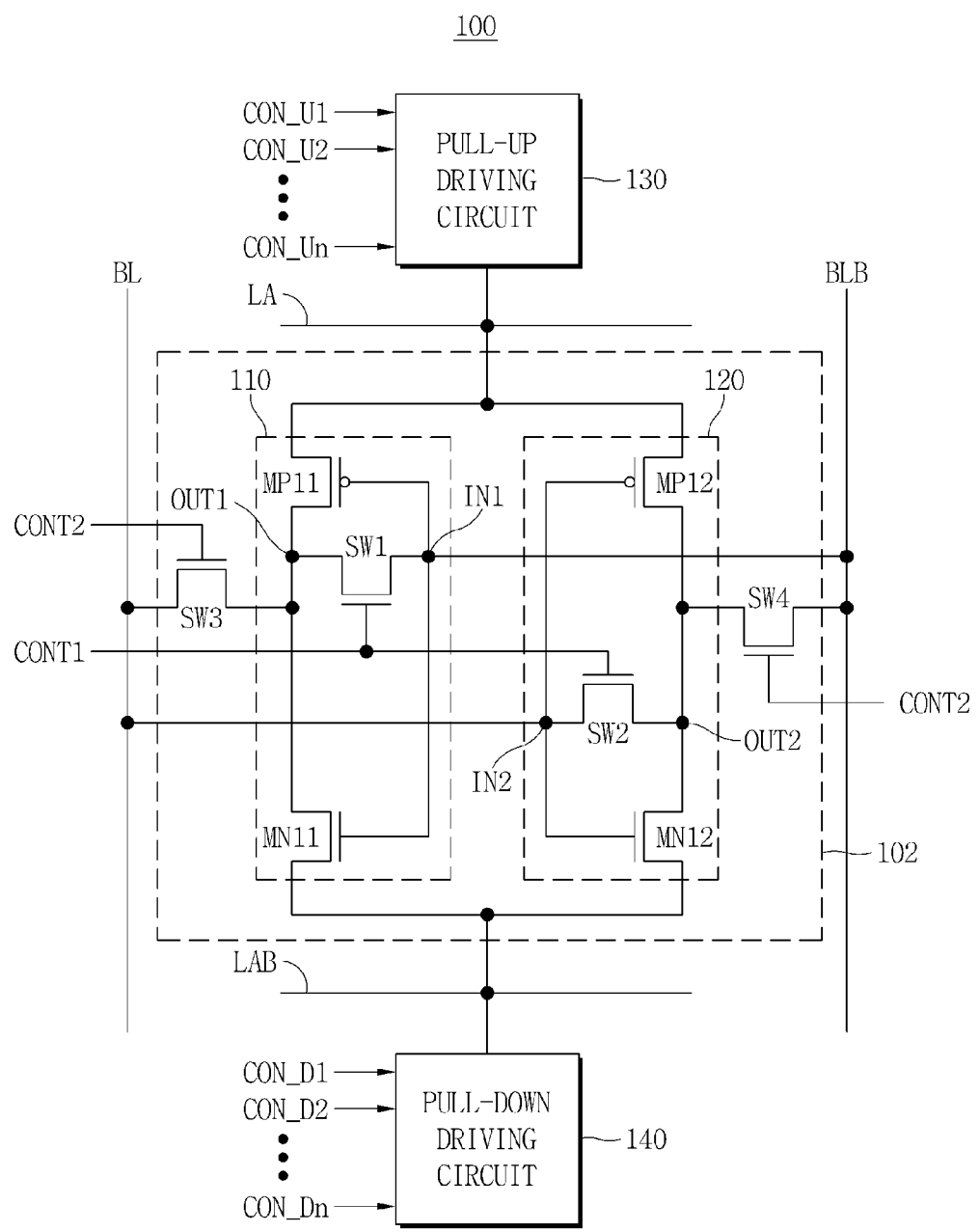
FIG. 1 is an exemplary circuit diagram illustrating a bit-line sense amplifier according to an embodiment of the inventive concept.

Various example embodiments are described below in sufficient detail to enable those of ordinary skill in the art to embody and practice the inventive concept. It is important to understand that the inventive concept may be embodied in many alternate forms and should not be construed as limited to the embodiments set forth herein.

Accordingly, while the inventive concept is susceptible to various modifications and may take on various alternative forms, specific embodiments thereof are shown by way of example in the drawings and will herein be described in detail. It should be understood, however, that there is no intent to limit the inventive concept to the particular forms disclosed. On the contrary, the inventive concept is to cover all modifications, equivalents, and alternatives falling within the spirit and scope of the claims.

It will be understood that, although the terms first, second, etc. may be used herein to describe various elements, these elements should not be limited by these terms. Unless indicated otherwise, these terms are only used to distinguish one element from another. For example, a first element could be termed a second element, and, similarly, a second element could be termed a first element, without departing from the scope of the inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (i.e., "between" versus "directly between," "adjacent" versus "directly adjacent," etc.).

The terminology used herein to describe embodiments of the inventive concept is not intended to limit the scope of the inventive concept. The articles "a," "an," and "the" are singular in that they have a single referent, however the use of the singular form in the present document should not preclude the presence of more than one referent. In other words, elements of the inventive concept referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

The present disclosure will now be described more fully with reference to the accompanying drawings, in which embodiments of the inventive concept are shown.

FIG. 1 is an exemplary circuit diagram illustrating a bit-line sense amplifier 100 according to an embodiment of the inventive concept.

Referring to FIG. 1, the bit-line sense amplifier 100 may include a pull-up driving circuit 130, a pull-down driving circuit 140 and a latch-type sense amplifier 102.

The pull-up driving circuit 130 generates a first driving current that is changeable in response to up control signals CON_U1 to CON_Un and provides the first driving current to a first driving power supply line LA. The up control signals CON_U1 to CON_Un may have a plurality of bits each having a logic level '0' or a logic level '1.' The pull-down driving circuit 140 generates a second driving current that is changeable in response to down control signals CON_D1 to CON_Dn and provides the second driving current to a second driving power supply line LAB. The down control signals CON_D1 to CON_Dn may have a plurality of bits each having a logic level '0' or a logic level '1.' The latch-type sense amplifier 102 is connected to the first driving power supply line LA and the second driving power supply line LAB, and senses and amplifies a voltage difference between a bit line BL and a complementary bit line BLB (or, a voltage difference between a first bit line BL1 and a second bit line BL2).

The latch-type sense amplifier 102 may include a first inverter 110, a second inverter 120, and switches SW1, SW2, SW3 and SW4. For example, each of the switches SW1, SW2, SW3 and SW4 may be an NMOS transistor. The first inverter 110 includes a first PMOS transistor MP11 and a first NMOS transistor MN11 commonly connected to the complementary bit line BLB, and a second inverter 120 includes a second PMOS transistor MP12 and a second NMOS transistor MN12 commonly connected to the bit line BL.

The first switch SW1 electrically connects an output terminal of the first inverter 110 to an input terminal of the first inverter 110 in response to a first control signal CONT1. The second switch SW2 electrically connects an output terminal of the second inverter 120 to an input terminal of the second inverter 120 in response to the first control signal CONT1. The third switch SW3 electrically connects the output terminal of the first inverter 110 to the bit line BL in response to a second control signal CON2. The fourth switch SW4 electrically connects the output terminal of the second inverter 120 to the complementary bit line BLB in response to the second control signal CONT2.

In FIG. 1, the first control signal CONT1 may be a precharge control signal, and the second control signal CON2 may be a signal having an opposite phase of the precharge control signal.

Figure 2:
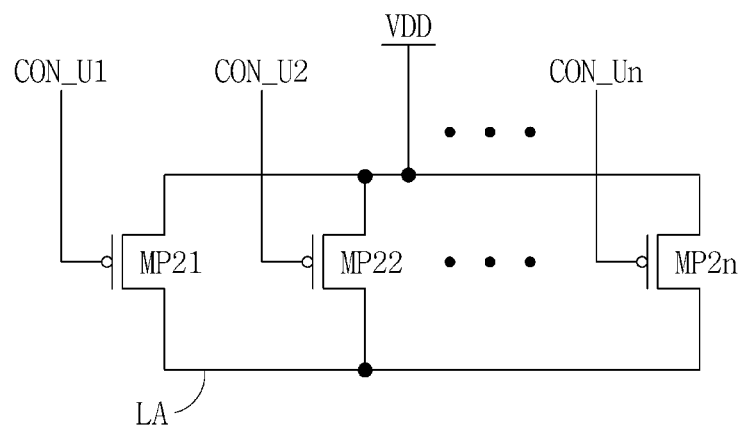
FIG. 2 is a circuit diagram illustrating an example of a pull-up driving circuit included in the bit-line sense amplifier of FIG. 1.

FIG. 2 is a circuit diagram illustrating an example of a pull-up driving circuit 130 included in the bit-line sense amplifier 100 of FIG. 1.

Referring to FIG. 2, the pull-up driving circuit 130 may include a plurality of PMOS transistors MP21 to MP2$n$ connected between a power supply voltage VDD and the first driving power supply line LA. The PMOS transistors MP21 to MP2$n$ may operate in response to bits CON_U1 to CON_Un of the up control signals. The power supply voltage VDD may be, for example, an internal power voltage IVCC having a voltage level less than the VDD generated from an internal voltage generator (not shown).

Figure 3:
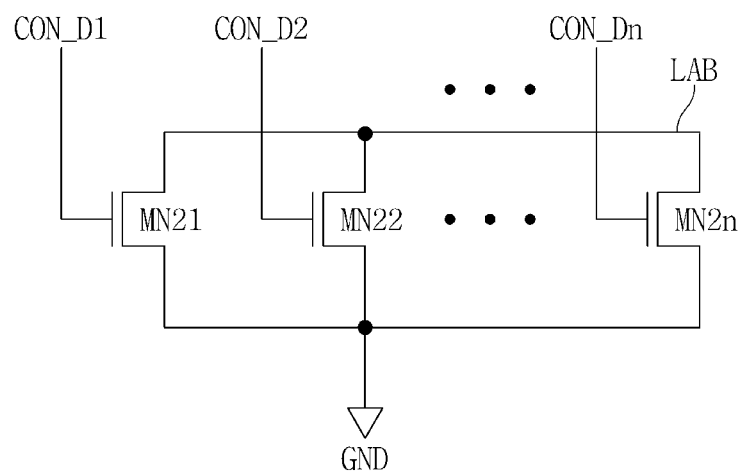
FIG. 3 is a circuit diagram illustrating another example of a pull-down driving circuit included in the bit-line sense amplifier of FIG. 1.

FIG. 3 is a circuit diagram illustrating another example of a pull-down driving circuit 140 included in the bit-line sense amplifier 100 of FIG. 1.

Referring to FIG. 3, the pull-down driving circuit 140 may include a plurality of NMOS transistors MN21 to MN2$n$ connected between a ground voltage GND and the second driving power supply line LAB. The NMOS transistors MN21 to MN2$n$ may operate in response to bits CON_D1 to CON_Dn of the down control signal. The ground voltage GND may be a negative voltage VBB having a voltage level below 0V generated from a negative voltage generator (not shown).

In one embodiment, the up control signals CON_U1 to CON_Un and the down control signals CON_D1 to CON_Dn may be generated from, for example, a mode register set 0 or a control circuit in a semiconductor memory device or outside the semiconductor memory device.

Figure 4:
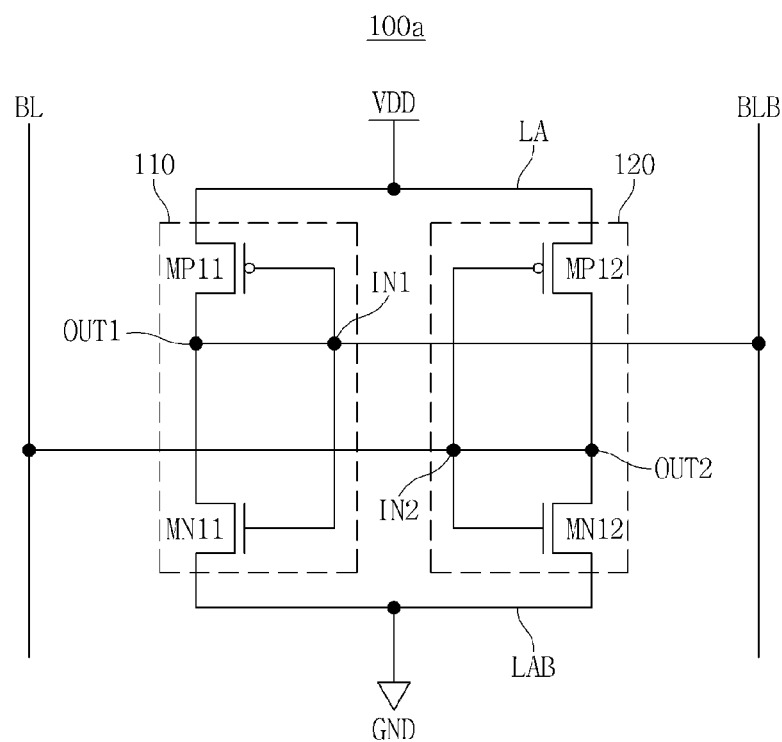
FIGS. 4 and 5 are example diagrams illustrating an operation of the bit-line sense amplifier when a first switch and a second switch are in on state and a third switch and a fourth switch are in off state in the circuit of FIG. 1.
Figure 5:
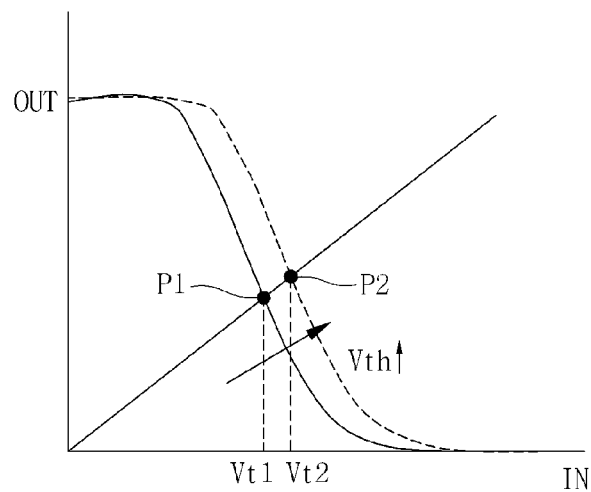

FIGS. 4 and 5 are example diagrams illustrating an operation of the bit-line sense amplifier when a first switch and a second switch are in on state and a third switch and a fourth switch are in off state in the circuit of FIG. 1. For the sake of convenience, in FIGS. 4 and 5, the embodiment in which the supply voltage VDD is applied to the first driving power supply line LA and the ground voltage GND is applied to second driving power supply line LAB is shown. For example, as shown in FIG. 1, in the bit-line sense amplifier 100 according to one embodiment of the inventive concept, an adjustable first driving current generated by the pull-up driving circuit 130 may be supplied to the first driving power supply line LA, and an adjustable second driving current generated by the pull-down driving circuit 140 may be supplied to the second driving power supply line LAB.

When the first switch SW1 and the second switch SW2 are in on state and the third switch SW3 and the fourth switch SW4 are in off state, a threshold voltage Vt1 of the first inverter 110 may be set as a voltage of the complementary bit line BLB, and a threshold voltage Vt2 of the second inverter 120 may be set as a voltage of the bit line BL. For example, when threshold voltages of transistors included in the inverters 110 and 120 are high, threshold voltages of the inverters 110 and 120 may also be high.

FIG. 5 is a graph illustrating an embodiment of voltage setting when an input terminal and an output terminal of each of the first inverter 110 and the second inverter 120 are connected. In FIG. 5, when the solid line represents a characteristic curve of the first inverter 110 and the dotted line represents a characteristic curve of the second inverter 120, the threshold voltage of the first inverter 110 may be Vt1, and the threshold voltage of the second inverter 120 may be Vt2. For example, threshold voltages of the first inverter 110 and the second inverter 120 may have different values because the transistors included in the first inverter 110 and the second inverter 120 are unmatched.

Referring to FIGS. 4 and 5, the voltage level of the complementary bit line BLB connected to an input terminal IN1 and an output terminal OUT1 of the first inverter 110 may have a value of Vt1, and the voltage level of the bit line BL connected to an input terminal IN2 and an output terminal OUT2 of the second inverter 120 may have a value of Vt2. For example, the bit line BL may have a higher voltage level than the complementary bit line BLB by (Vt2−Vt1).

The bit-line sense amplifier 100 of FIG. 1 may compensate mismatch of transistors included in the bit-line sense amplifier 100 by determining the voltage level of the bit line BL or the complementary bit line BLB using threshold voltages of the first inverter 110 and the second inverter 120. For example, the mismatch may be compensated by applying a difference of threshold voltages of the first inverter 110 and the second inverter 120 to the bit line BL or the complementary bit line BLB before the bit-line sense amplifier 100 performs sensing and amplifying. Further, the bit-line sense amplifier 100 of FIG. 1 may further compensate mismatch of transistors included in the bit-line sense amplifier 100 by supplying the adjustable first driving current generated by the pull-up driving circuit 130 to the first driving power supply line LA, and by supplying the adjustable second driving current generated by the pull-down driving circuit 140 to the second driving power supply line LAB.

Figure 6:
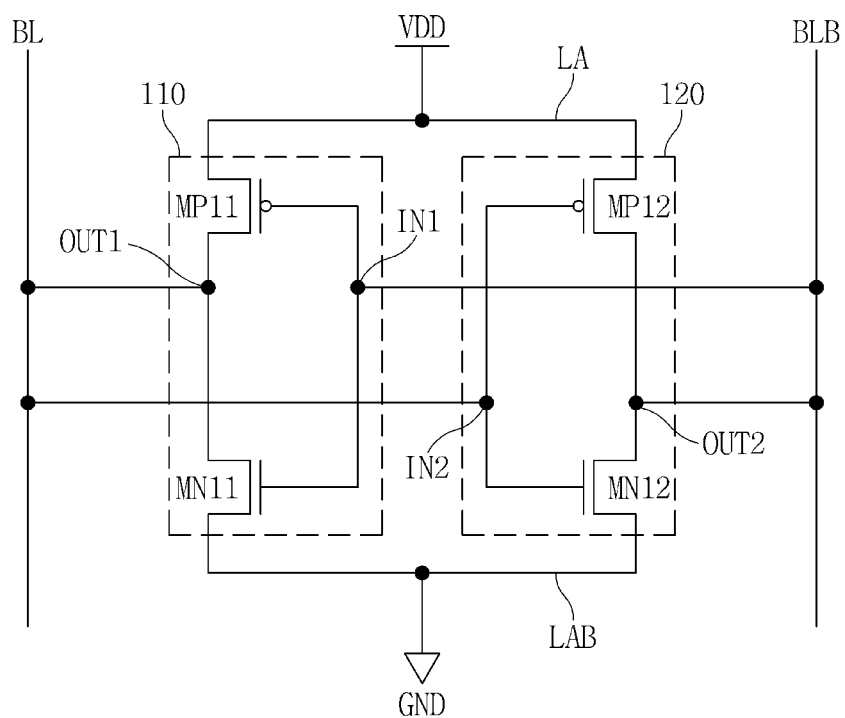
FIG. 6 is a diagram illustrating an example operation of the bit-line sense amplifier when a first switch and a second switch are in off state and a third switch and a fourth switch are in on state in the circuit of FIG. 1.

FIG. 6 is a diagram illustrating an example operation of the bit-line sense amplifier when a first switch and a second switch are in off state and a third switch and a fourth switch are in on state in the circuit of FIG. 1.

When the first switch SW1 and the second switch SW2 are in off state and the third switch SW3 and the fourth switch SW4 are in on state, the input terminal of the first inverter 110 is electrically connected to the complementary bit line BLB and the output terminal of the first inverter 110 is electrically connected to the bit line BL. Further, the input terminal of the second inverter 120 is electrically connected to the bit line BL and the output terminal of the second inverter 120 is electrically connected to the complementary bit line BLB. For example, the bit-line sense amplifier 100 of FIG. 1 operates in a normal mode (e.g., read, write, active, or refresh operation) in which the bit-line sense amplifier 100 senses and amplifies a voltage difference between the bit line BL and the complementary bit line BLB.

Figure 7A:
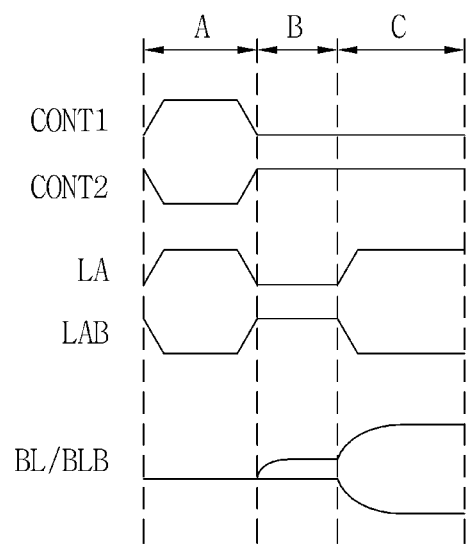
FIGS. 7A and 7B are timing diagrams illustrating compensation of mismatch between transistors, according to example embodiments of the inventive concept.
Figure 7B:
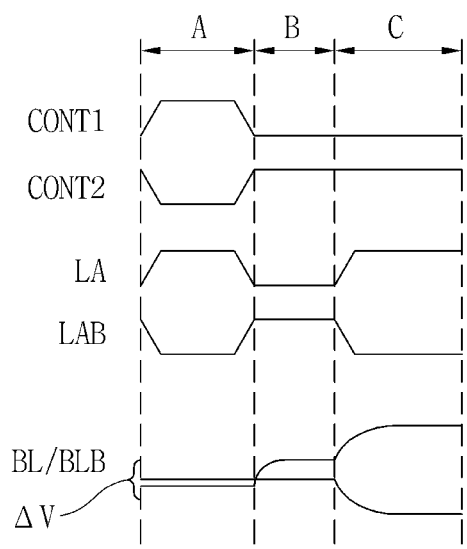

FIGS. 7A and 7B are timing diagrams illustrating compensation of mismatch between transistors, according to example embodiments of the inventive concept. FIG. 7A is a timing diagram for explaining the operation of the bit-line sense amplifier 100 when mismatch among transistors included in the bit-line sense amplifier 100 does not exist, and FIF. 7B is a timing diagram for explaining the operation of the bit-line sense amplifier 100 when mismatch among transistors included in the bit-line sense amplifier 100 exists.

In FIGS. 7A and 7B, section "A" represents a section in which a first control signal CONT1 is in a logic high state and a second control signal CONT2 is in a logic low state. In section "A", the bit-line sense amplifier 100 may operate as illustrated in FIG. 4, and may set voltages of the bit line BL and the complementary bit line BLB. Sections "B" and "C" represent sections in which the first control signal CONT1 is in a logic low state and the second control signal CONT2 is in a logic high state. In sections "B" and "C", the bit-line sense amplifier 100 may operate as illustrated in FIG. 6, and may sense and amplify a voltage difference between the bit line BL and the complementary bit line BLB.

Referring to FIG. 7A, in section "A", the voltage levels of the bit line BL and the complementary bit line BLB are equal. This means that the threshold voltages of the first inverter 110 and the second inverter 120 are the same, and mismatch may not exist between the first inverter 110 and the second inverter 120.

Referring to FIG. 7B, in section "A", the voltage difference between the bit line BL and the complementary bit line BLB exists. This means that a voltage difference between the threshold voltage of the first inverter 110 and the threshold voltage of the second inverter 120 exists, and mismatch between the first inverter 110 and the second inverter 120 exist.

Figure 8:
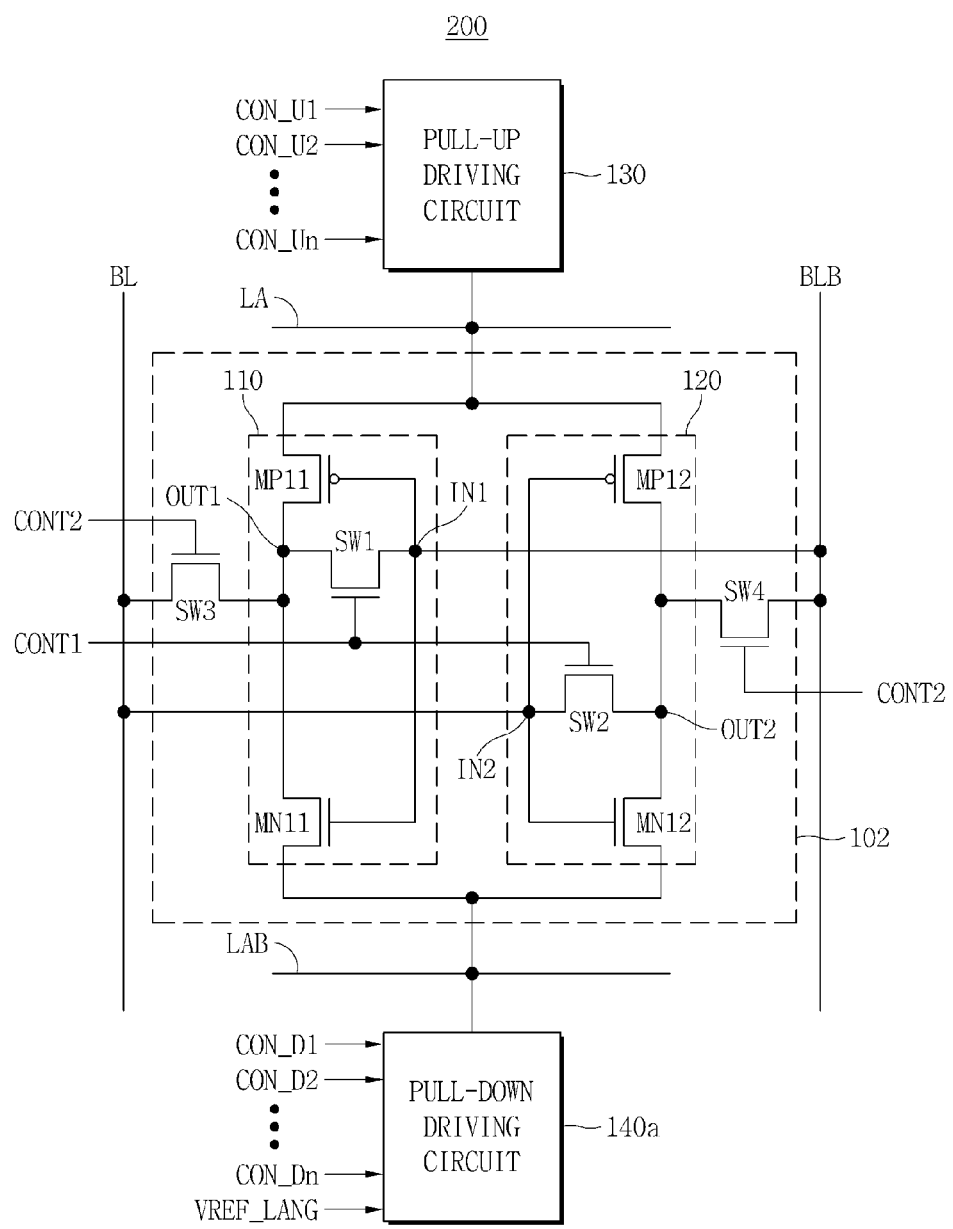
FIG. 8 is an exemplary circuit diagram illustrating a bit-line sense amplifier according to another embodiment of the inventive concept.

FIG. 8 is an exemplary circuit diagram illustrating a bit-line sense amplifier 200 according to another embodiment of the inventive concept.

Referring to FIG. 8, the bit-line sense amplifier 200 may include a pull-up driving circuit 130, a pull-down driving circuit 140a and a latch-type sense amplifier 102.

The pull-up driving circuit 130 generates a first driving current that is changeable in response to up control signals CON_U1 to CON_Un and provides the first driving current to a first driving power supply line LA. The pull-down driving circuit 140a generates a second driving current that is changeable in response to a driving-current control signal VREF_LANG and down control signals CON_D1 to CON_Dn and provides the second driving current to a second driving power supply line LAB. The latch-type sense amplifier 102 is connected to the first driving power supply line LA and the second driving power supply line LAB, and senses and amplifies a voltage difference between a bit line BL and a complementary bit line BLB (or, a voltage difference between a first bit line BL1 and a second bit line BL2).

The pull-down driving circuit 140a in the bit-line sense amplifier 200 of FIG. 8 is different from that in the bit-line sense amplifier 100 of FIG. 1. The remaining circuit blocks in the bit-line sense amplifier 200 are the same as those in the bit-line sense amplifier 100 of FIG. 1.

Figure 9:
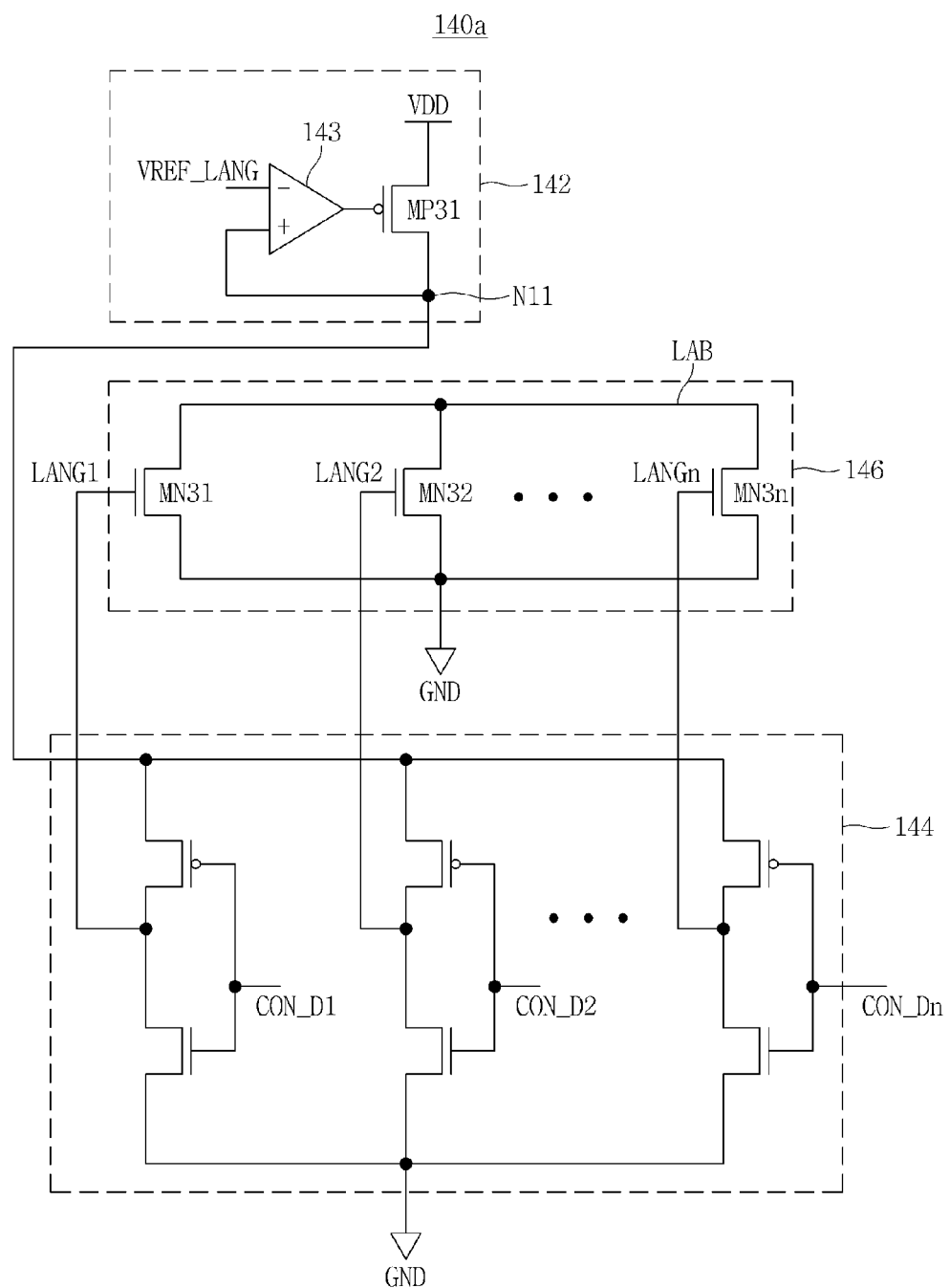
FIG. 9 is a circuit diagram illustrating an example of a pull-down driving circuit included in the bit-line sense amplifier of FIG. 8 according to one embodiment.

FIG. 9 is a circuit diagram illustrating an example of a pull-down driving circuit 140a included in the bit-line sense amplifier 200 of FIG. 8 according to one embodiment.

Referring to FIG. 9, the pull-down driving circuit 140a may include a voltage adjusting circuit 142 configured to regulate a power supply voltage VDD in response to a driving-current control signal VREF_LANG (e.g., a reference voltage) to generate a first voltage on a first node N11, a first driving circuit 144 configured to generate gate driving voltages LANG1 to LANGn in response to down control signals CON_D1 to CON_Dn and the first voltage, and a second driving circuit 146 configured to provide (e.g., generate) a second driving current on the second driving power supply line LAB in response to the gate driving voltages LANG1 to LANGn. For example, the driving-current control signal VREF_LANG may be generated from a reference voltage generator (not shown) and may have various voltage levels.

The voltage adjusting circuit 142 may include a differential amplifier 143 having an inverted input terminal to which the driving-current control signal VREF_LANG is applied, and a non-inverted input terminal connected to the first node N11, and a PMOS transistor MP31 having a gate connected to an output terminal of the differential amplifier 143, a source connected to the power supply voltage VDD, and a drain connected to the first node N11. The first driving circuit 144 may include a plurality of inverters comprised of PMOS transistors and NMOS transistors connected between the first node N11 and the ground voltage GND, and generate bits LANG1 to LANGn of the gate driving voltage in response to bits CON_D1 to CON_Dn of the down control signal. The second driving circuit 146 may include a plurality of NMOS transistors MN31 to MN3n connected between the ground voltage GND and the second driving power supply line LAB, and the NMOS transistors MN31 to MN3n may operate in response to bits LANG1 to LANGn of the gate driving voltage.

The pull-down driving circuit 140a may adjust an amount of the second driving current supplied to the second driving power supply line LAB in response to not only the down control signals CON_D1 to CON_Dn but also the driving-current control signal VREF_LANG. For example, voltage levels of the gate driving voltages LANG1 to LANGn may be changed based on a voltage level of the driving-current control signal VREF_LANG and logic levels of bits of the down control signals CON_D1 to CON_Dn.

Figure 10:
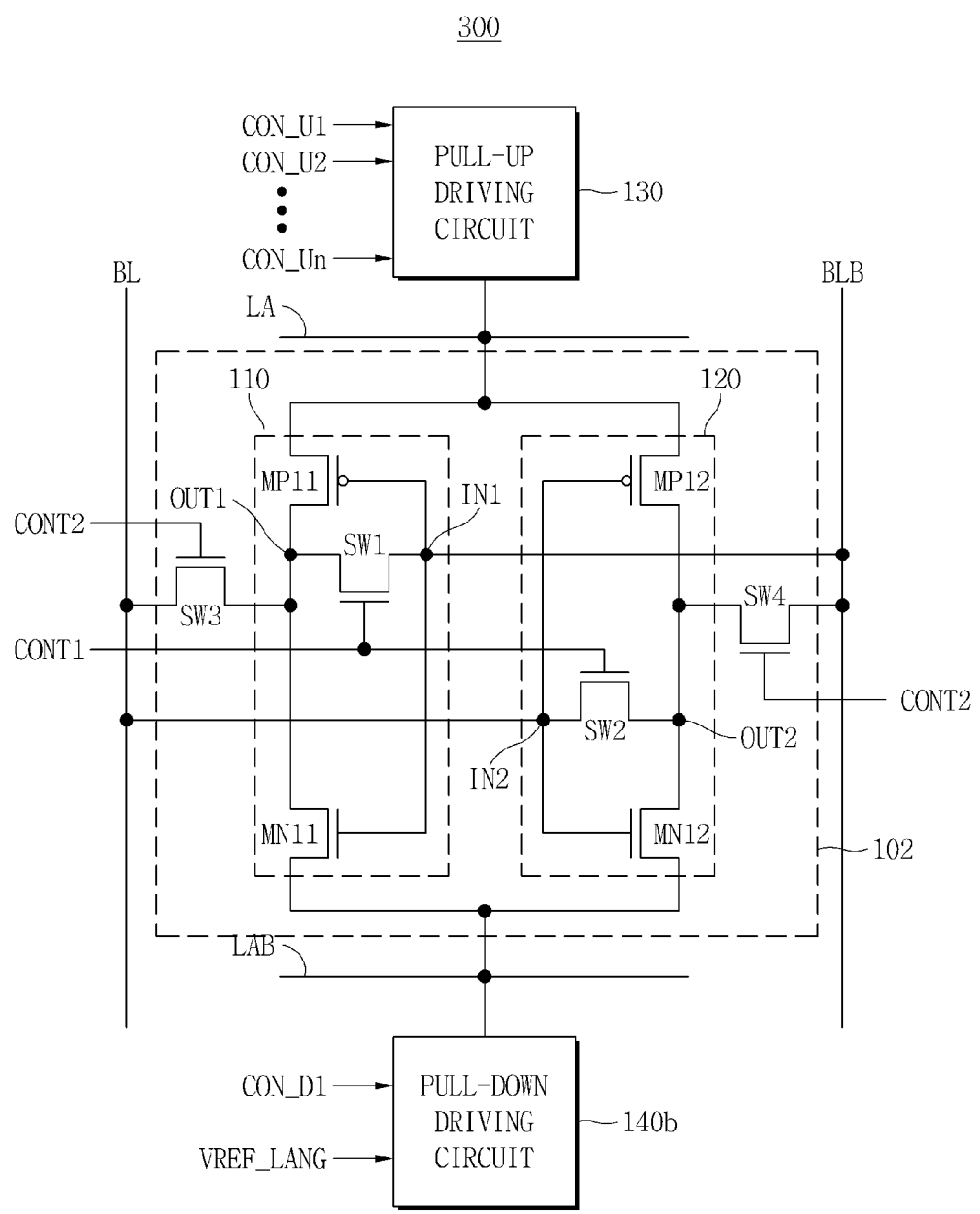
FIG. 10 is an exemplary circuit diagram illustrating a bit-line sense amplifier according to still another embodiment of the inventive concept.

FIG. 10 is an exemplary circuit diagram illustrating a bit-line sense amplifier 300 according to still another embodiment of the inventive concept.

Referring to FIG. 10, the bit-line sense amplifier 300 may include a pull-up driving circuit 130, a pull-down driving circuit 140b and a latch-type sense amplifier 102.

The pull-up driving circuit 130 generates a first driving current that is changeable in response to up control signals CON_U1 to CON_Un and provides the first driving current to a first driving power supply line LA. The pull-down driving circuit 140b generates a second driving current that is changeable in response to a driving-current control signal VREF_LANG and a down control signal CON_D1 and provides the second driving current to a second driving power supply line LAB. The latch-type sense amplifier 102 is connected to the first driving power supply line LA and the second driving power supply line LAB, and senses and amplifies a voltage difference between a bit line BL and a complementary bit line BLB (or, a voltage difference between a first bit line BL1 and a second bit line BL2).

The pull-down driving circuit 140b in the bit-line sense amplifier 300 of FIG. 10 is different from that in the bit-line sense amplifier 100 of FIG. 1. The remaining circuit blocks in the bit-line sense amplifier 300 are same as those in the bit-line sense amplifier 100 of FIG. 1.

Figure 11:
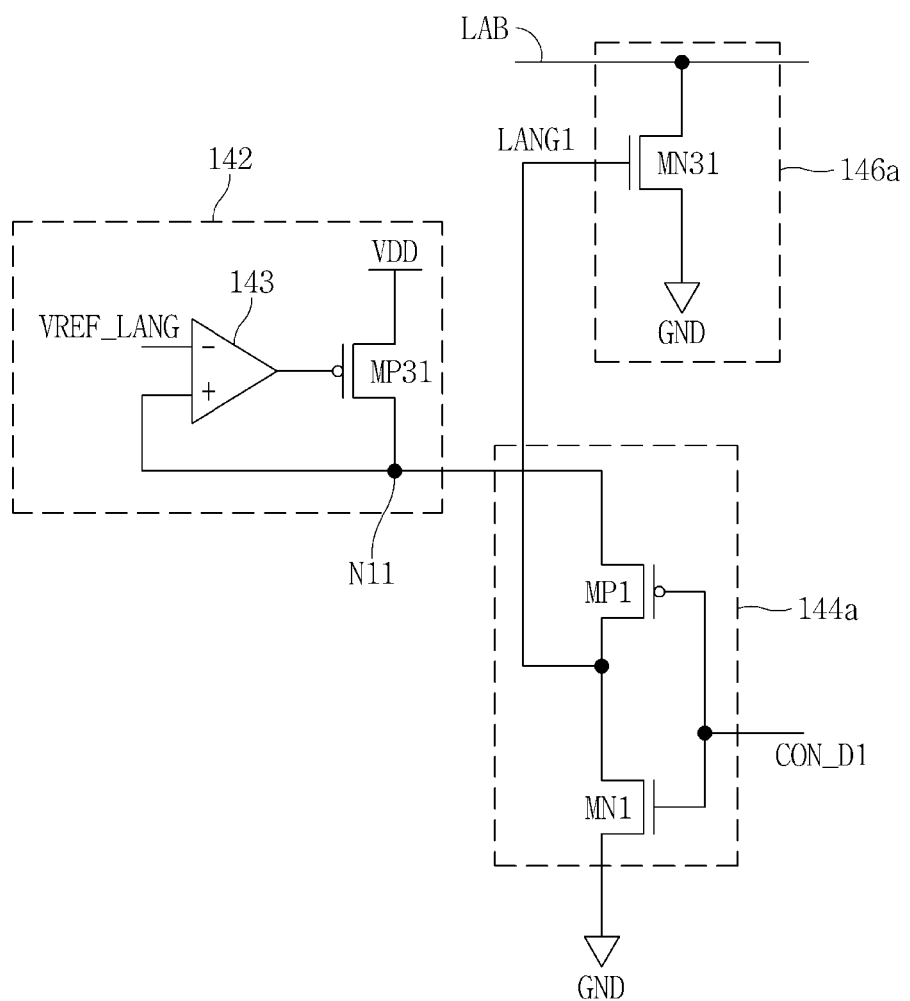
FIG. 11 is a circuit diagram illustrating an example of a pull-down driving circuit included in the bit-line sense amplifier of FIG. 10 according to one embodiment.

FIG. 11 is a circuit diagram illustrating another example of a pull-down driving circuit 140b included in the bit-line sense amplifier of FIG. 10 according to one embodiment.

Referring to FIG. 11, the pull-down driving circuit 140b may include a voltage adjusting circuit 142 configured to regulate a power supply voltage VDD in response to a driving-current control signal VREF_LANG (e.g., a reference voltage) to generate a first voltage on a first node N11, a first driving circuit 144a configured to generate a gate driving voltage LANG1 in response to a down control signal CON_D1 and the first voltage, and a second driving circuit 146a configured to provide (e.g., generate) the second driving current on the second driving power supply line LAB in response to the gate driving voltage LANG1.

In the pull-down driving circuit 140b of FIG. 11, different from the pull-down driving circuit 140a of FIG. 9, the first driving circuit 144a may include one inverter, and the second driving circuit 146a may include one NMOS transistor MN31.

Figure 12:
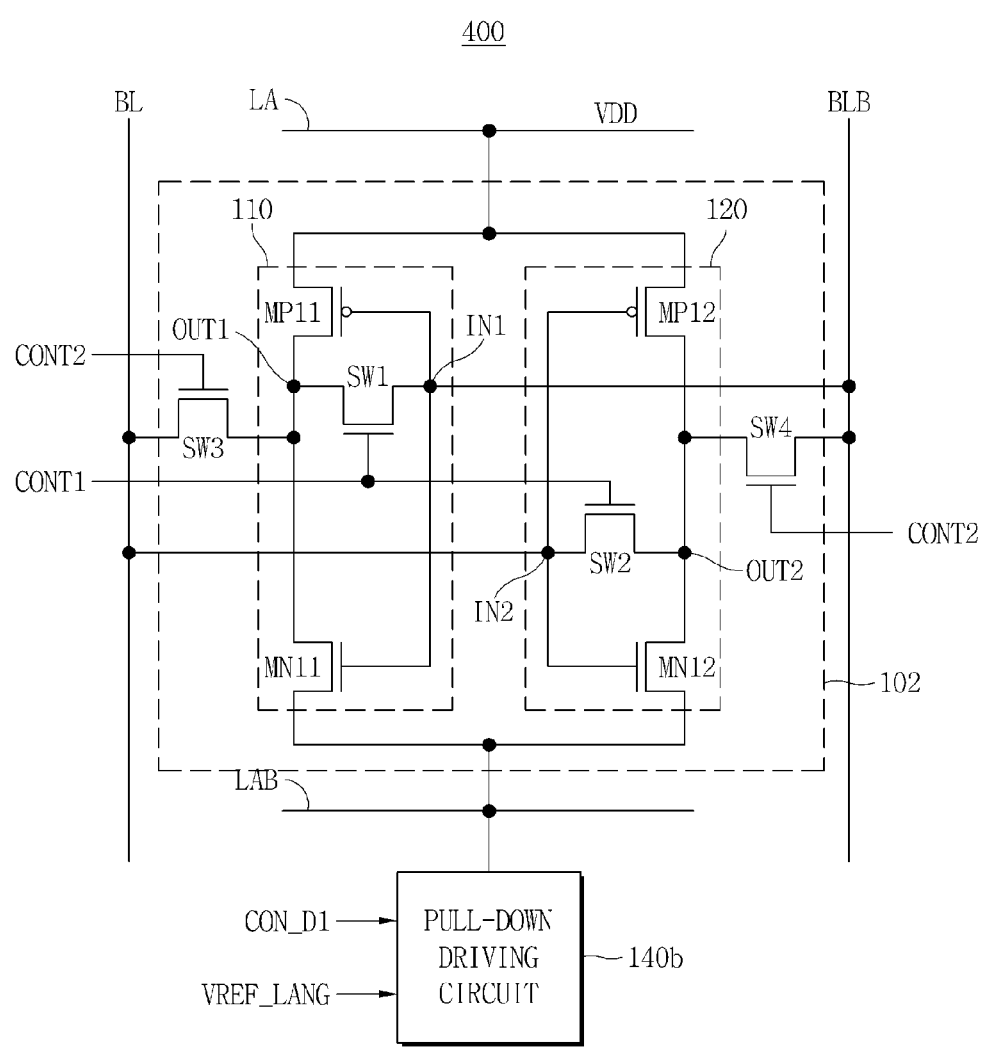
FIG. 12 is an exemplary circuit diagram illustrating a bit-line sense amplifier according to yet another embodiment of the inventive concept.

FIG. 12 is an exemplary circuit diagram illustrating a bit-line sense amplifier 400 according to yet another embodiment of the inventive concept.

The bit-line sense amplifier 400 of FIG. 12 has a similar circuit structure of the bit-line sense amplifier 300 of FIG. 10. However, the bit-line sense amplifier 400 of FIG. 12 does not include the pull-up driving circuit 130 and the power supply voltage VDD may be provided to the first driving power supply line LA, different from the bit-line sense amplifier 300 of FIG. 10.

Figure 13:
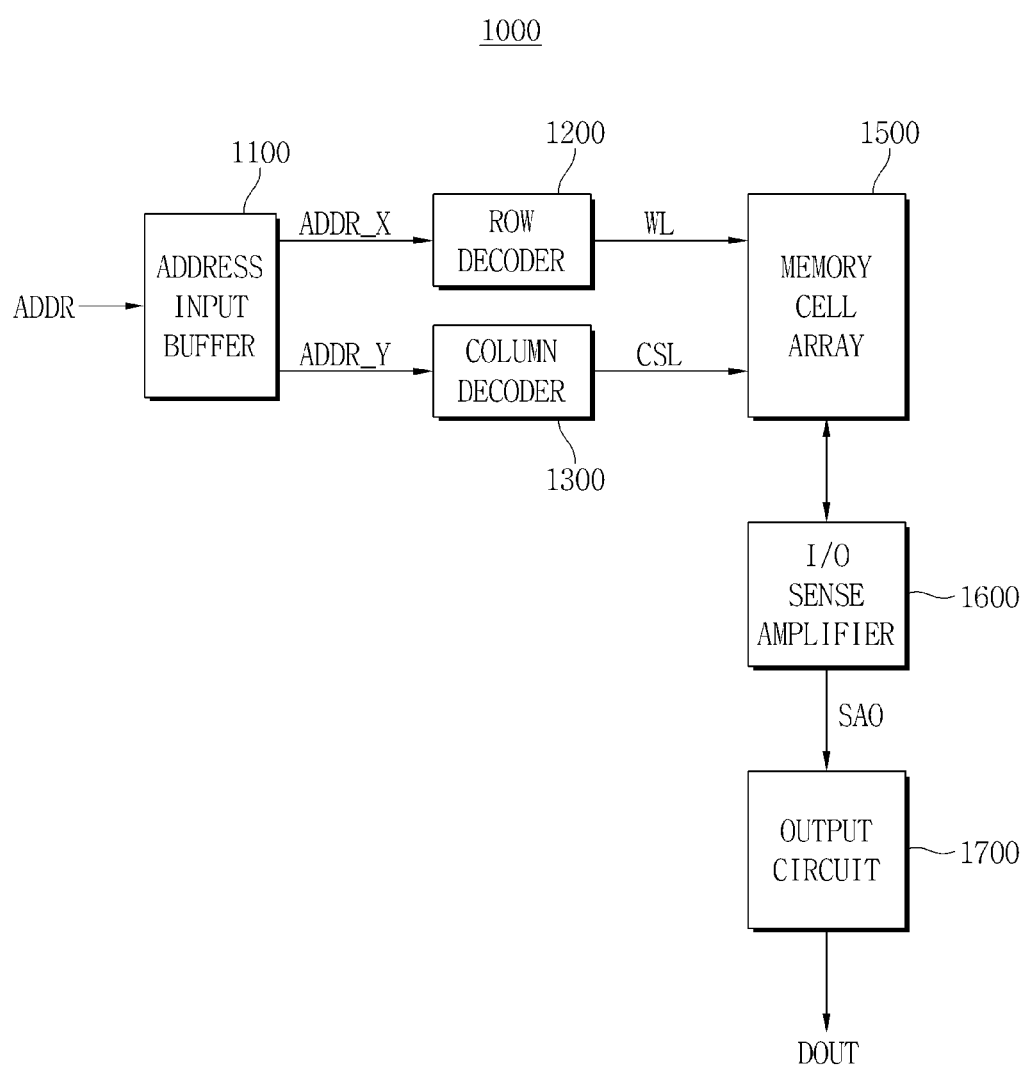
FIG. 13 is a block diagram illustrating a semiconductor memory device including the bit-line sense amplifier according to certain embodiments of the inventive concept.

FIG. 13 is a block diagram illustrating a semiconductor memory device 1000 including the bit-line sense amplifier according to certain embodiments of the inventive concept.

As used herein, a semiconductor device may refer to various items such as a memory device, one or more logic devices or memory cells formed in or on a semiconductor substrate, a semiconductor chip, a memory chip, a logic chip, a package, or combinations thereof. A semiconductor device such as a semiconductor chip, a memory chip, or a logic chip may be formed from a wafer. A semiconductor device may include one or more chips stacked on a package substrate, or a package-on-package device including a plurality of packages. A semiconductor device refers to a semiconductor device that includes an array of memory cells.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc. As used herein, a bit-line sense amplifier may be included in at least one of these devices.

Referring to FIG. 13, the semiconductor memory device 1000 includes a memory cell array 1500 configured to operate in response to a word line signal WL and a column select signal CSL, an address input buffer 1100, a row decoder 1200, a column decoder 1300, an input/output (I/O) sense amplifier 1600 and an output circuit 1700.

The address input buffer 1100 generates a row address signal ADDR_X and a column address signal ADDR_Y based on an external address ADDR. The row decoder 1200 decodes the row address signal ADDR_X to generate the word line signal WL. The column decoder 1300 decodes the column address signal ADDR_Y to generate the column select signal CSL. The memory cell array 1500 may include word lines, bit lines, memory cells arranged at intersecting points of the word lines and the bit lines, and a bit-line sense amplifier that amplifies a voltage difference between two of the bit lines (e.g., a bit line and a complementary bit line BL and BLB, or a first bit line and a second bit line BL1 and BL2), and operates in response to the word line signal WL and the column select signal CSL. The bit-line sense amplifier included in the memory cell array 1500 may be a sense amplifier according to disclosed embodiments. The I/O sense amplifier 1600 amplifies data output from the memory cell array 1500 to generate a first data SAO, and transfers data received from the outside to the memory cell array 1500. The output circuit 1700 may generate output data DOUT based on the first data SAO.

Figure 14:
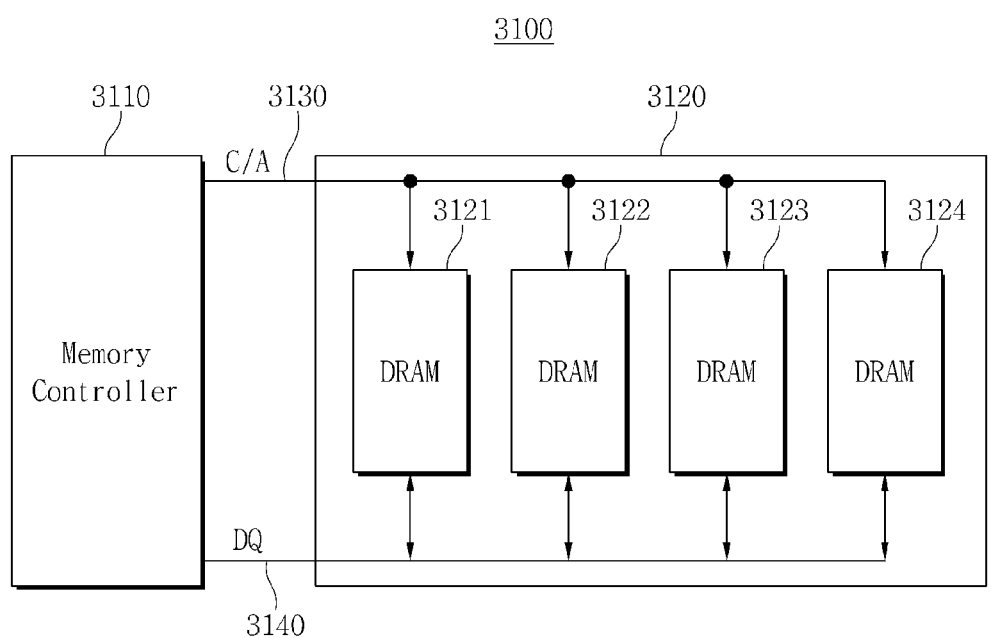
FIG. 14 is a block diagram illustrating a memory system including the semiconductor memory device according to certain embodiments of the inventive concept.

FIG. 14 is a block diagram illustrating a memory system 3100 including the semiconductor memory device according to certain embodiments of the inventive concept.

Referring to FIG. 14, the memory system may include a memory controller 3110 and a memory module 3120.

The memory module 3120 including four DRAMs is shown in FIG. 14, but the memory module 3120 may include four DRAMs or more. First to fourth DRAMs 3121 to 3124 may be mounted on both sides of a substrate. One or more of the first to fourth DRAMs 3121 to 3124 may include a bit-line sense amplifier such as disclosed herein.

The memory controller 3110 may generate a command/address signal C/A and data DQ. The memory module 3120 may operate in response to the C/A and the data DQ. The command/address signal C/A is packet data in which a command signal and an address signal are combined in a packet form.

The command/address bus 3130 may have a fly-by structure, and electrically connect the first to fourth DRAMs 3121 to 3124 to each other. Data DQ may be transmitted or received between the memory controller 2510 and the first to fourth DRAMs 3121 to 3124 included in the memory module 3120.

Figure 15:
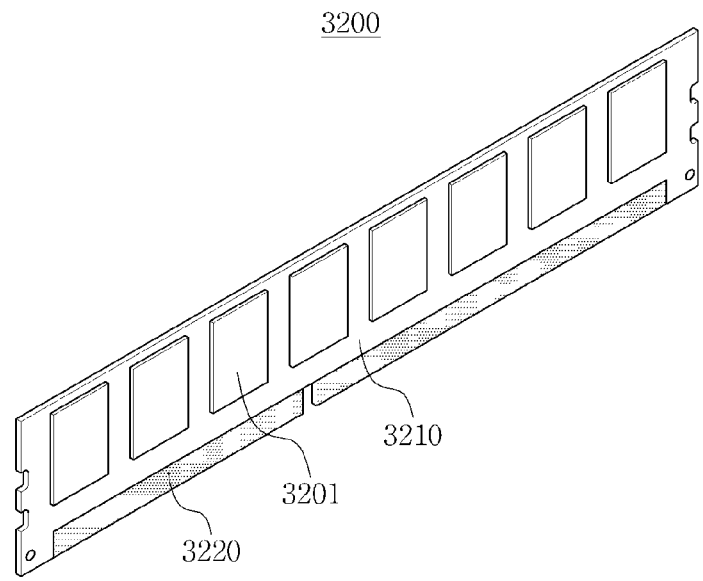
FIGS. 15 to 17 are diagrams illustrating memory modules including the semiconductor memory device shown in FIG. 13, according to certain embodiments of the inventive concept.
Figure 16:
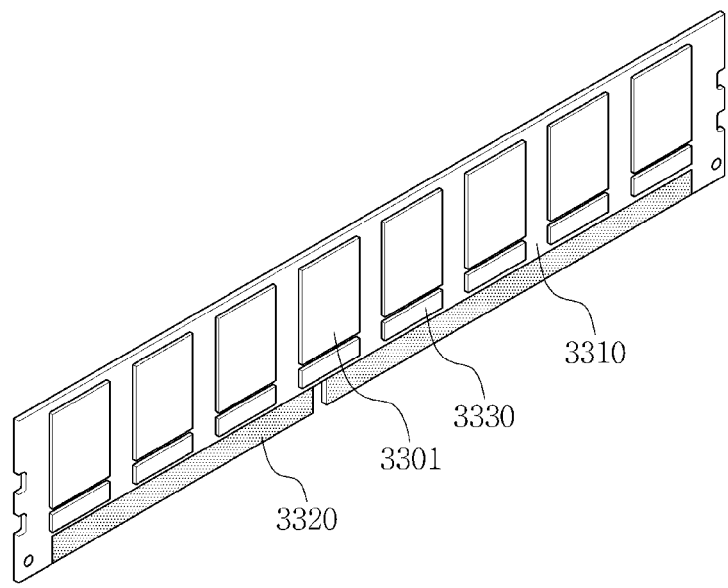
Figure 17:
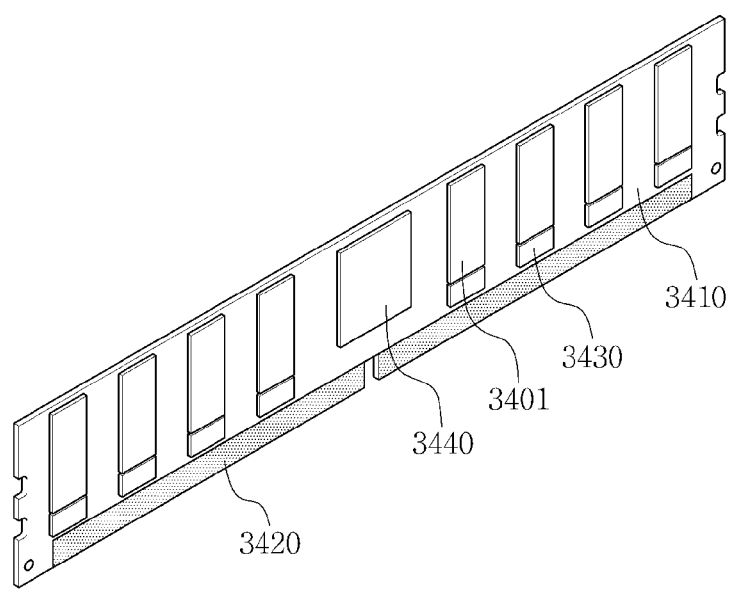

FIGS. 15 to 17 are diagrams illustrating memory modules 3200, 3300 and 3400 including the semiconductor memory device shown in 13 according to certain embodiments of the inventive concept.

Referring to FIG. 15, the memory module 3200 may include a printed circuit board (PCB) 3210, a plurality of semiconductor memory devices 3201, and a connector 3220. The plurality of semiconductor memory devices 3201 may be bonded to upper and lower surfaces of the PCB 3210. One or more of the semiconductor memory devices 3201 may include a bit-line sense amplifier such as disclosed herein. The connector 3220 may be electrically connected to the plurality of semiconductor memory devices 3201 through conductive lines (not shown). Also, the connector 3220 may be connected to a slot of an external host.

Referring to FIG. 16, the memory module 3300 may include a PCB 3310, a plurality of semiconductor memory devices 3301, a connector 3320, and a plurality of buffers 3330. Each of the plurality of buffers 3330 may be disposed between each semiconductor memory device 3301 and the connector 3320.

The plurality of buffers 3330 connected to the plurality of semiconductor memory devices 3301 may be provided on upper and lower surfaces of the PCB 3310. One or more of the semiconductor memory devices 3301 may include a bit-line sense amplifier such as disclosed herein. The semiconductor memory devices 3301 and the buffers 3330 formed on the upper and lower surfaces of the PCB 3310 may be connected through a plurality of via holes.

Referring to FIG. 17, the memory module 3400 may include a PCB 3410, a plurality of semiconductor memory devices 3401, a connector 3420, a plurality of buffers 3430, and a controller 3440.

The plurality of buffers 3430 connected to the plurality of semiconductor memory devices 3401 may be provided on upper and lower surfaces of the PCB 3410. The semiconductor memory devices 3401 and the buffers 3430 formed on the upper and lower surfaces of the PCB 3410 may be connected through a plurality of via holes. One or more of the semiconductor memory devices 3401 may include a bit-line sense amplifier such as disclosed herein. The controller 3440 transmits control signals to the plurality of semiconductor memory devices 3401, and transmits or receives data to or from the plurality of semiconductor memory devices 3401.

Figure 18:
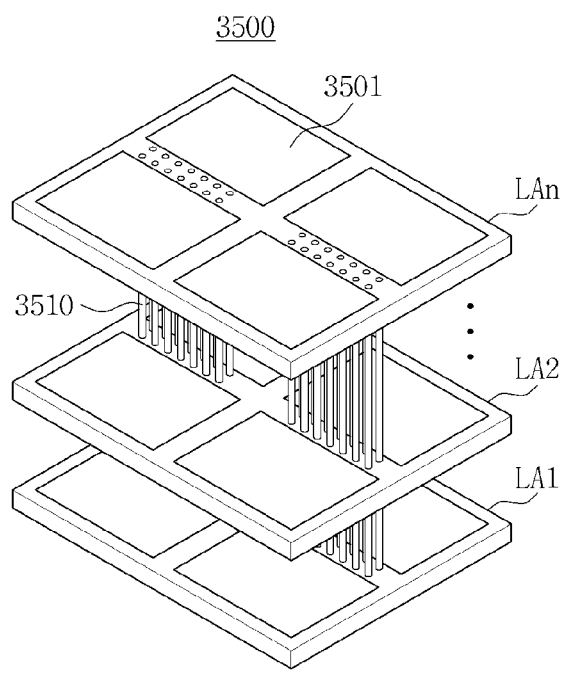
FIG. 18 is a perspective view of a semiconductor device having a stacked structure including a plurality of semiconductor layers, according to certain embodiments of the inventive concept.

FIG. 18 is a simplified perspective view of a stacked semiconductor device 3500 including a plurality of semiconductor layers according to certain embodiments of the inventive concept. In the memory modules 3200, 3300, and 3400 of FIGS. 15 to 17, each of the semiconductor memory devices 3201, 3301 or 3401 may include a plurality of semiconductor layers LA1 to LAn.

Referring to FIG. 18, in the stacked semiconductor device 3500, the plurality of stacked semiconductor layers LA1 to LAn may be connected to one another through through-substrate vias (e.g., through-silicon vias (TSVs)) 3510. Each of the plurality of stacked semiconductor layers LA1 to LAn may include memory blocks 3501.

Figure 19:
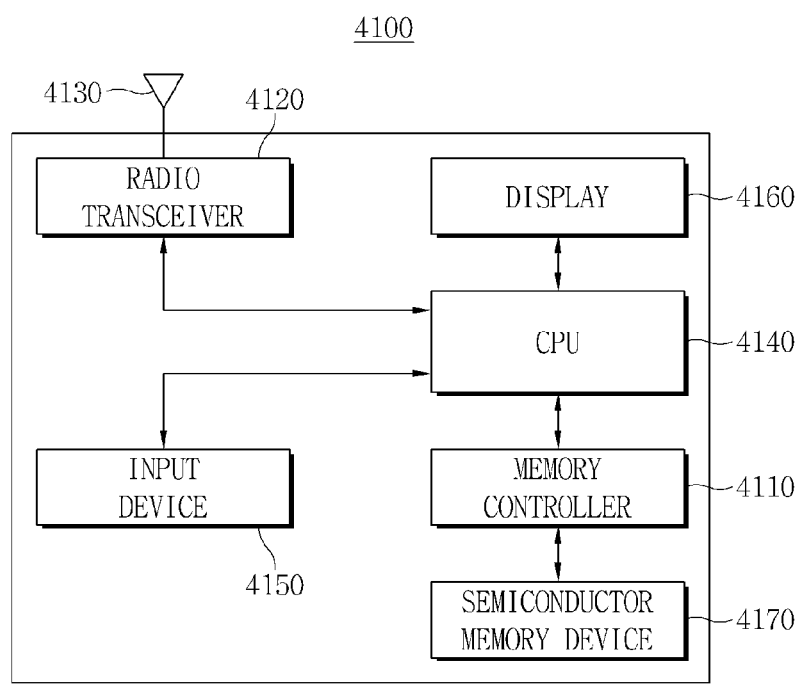
FIG. 19 is a block diagram illustrating an embodiment of a computer system including the semiconductor memory device according to certain embodiments of the inventive concept.

FIG. 19 is a block diagram illustrating an embodiment of a computer system 4100 including the semiconductor memory device 1000 shown in FIG. 13 according to certain embodiments of the inventive concept.

Referring to FIG. 19, the computer system 4100 may include a semiconductor memory device 4170, a memory controller 4110 that controls the semiconductor memory device 4170, a radio transceiver 4120, an antenna 4130, a central processing unit (CPU) 4140, an input device 4150 and a display 4160.

The radio transceiver 4120 may transmit or receive a radio signal through the antenna 4130. Further, the radio transceiver 4120 may convert the radio signal received from the antenna 4130 into a signal to be processed in the CPU 4140.

The CPU 4140 may process the signal output from the radio transceiver 4120 and transmit the processed signal to the display 4160. Further, the radio transceiver 4120 may convert the signal output from the CPU 4140 to a radio signal and output the converted signal to external devices.

The input device 4150 is a device that can input a control signal for controlling the operation of the CPU 4140 or data to be processed by the CPU 4140, and may be implemented as a pointing device such as a touch pad and a computer mouse, a keypad or a keyboard.

In the computer system 4100 shown in FIG. 19, the semiconductor memory device 4170 may include a bit-line sense amplifier such as disclosed herein.

Figure 20:
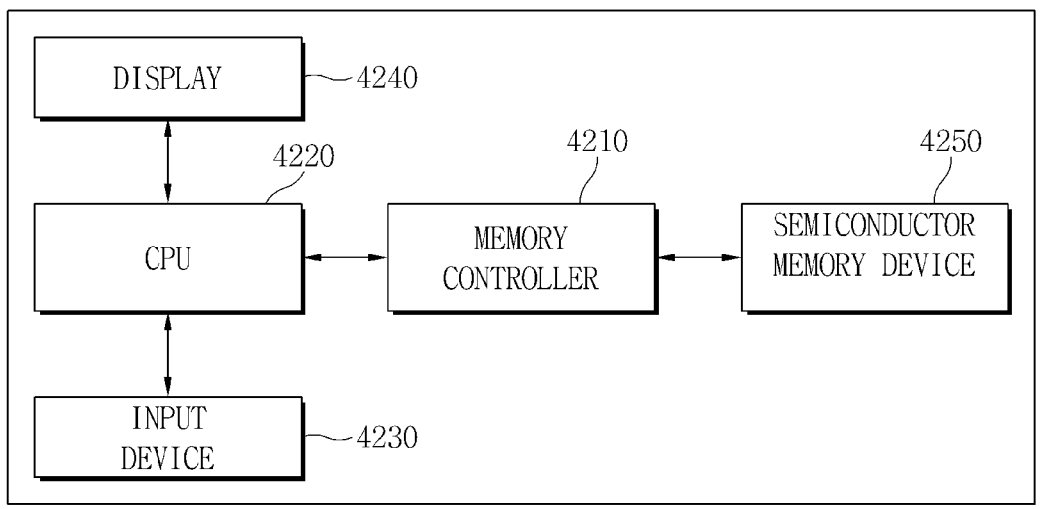
FIG. 20 is a block diagram illustrating another embodiment of a computer system including the semiconductor memory device according to certain embodiments of the inventive concept.

FIG. 20 is a block diagram illustrating another embodiment of a computer system 4200 including the semiconductor memory device according to certain embodiments of the inventive concept.

The computer system 4200 of FIG. 20 may be implemented as a personal computer (PC), a network server, a tablet PC, a net-book, an e-reader, a personal digital assistant (PDA), a portable multimedia player (PMP), an MP3 player or an MP4 player.

The computer system 4200 may include a semiconductor memory device 4250, a memory controller 4210 that controls a data processing operation of the semiconductor memory device 4250, a CPU 4220, an input device 4230 and a display 4240.

The CPU 4220 may display data stored in the semiconductor memory device 4250 through the display 4240 according to data received through the input device 4230. For example, the input device 4230 may be implemented as a pointing device such as a touch pad and a computer mouse, a keypad or a keyboard. The CPU 4220 may control an overall operation of the computer system 4200, and may control an operation of the memory controller 4210.

According to embodiments, the memory controller 4210 that can control an operation of the semiconductor memory device 4250 may be implemented as a part of the CPU 4220, or as a separate chip from the CPU 4220. The semiconductor memory device 4250 may include a bit-line sense amplifier such as disclosed herein.

Figure 21:
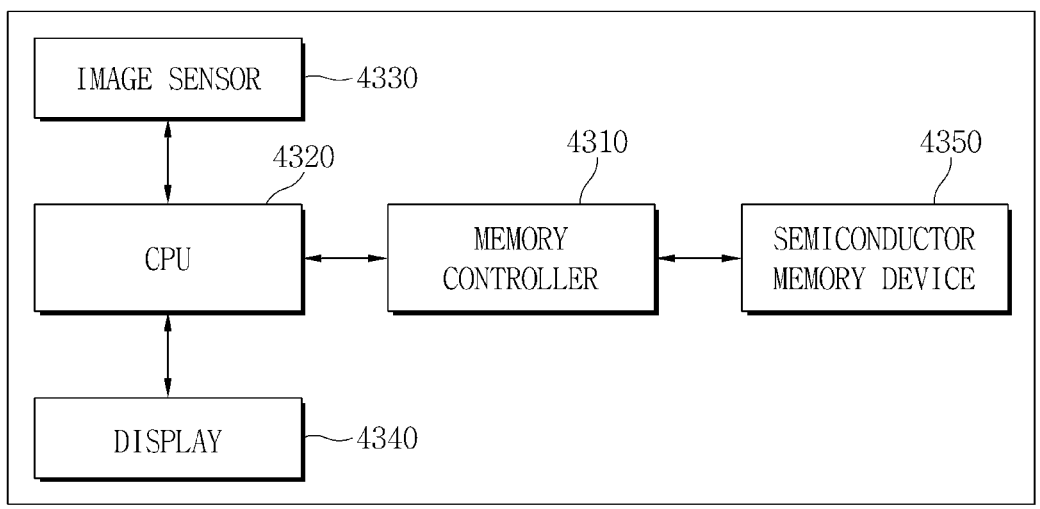
FIG. 21 is a block diagram illustrating still another embodiment of a computer system including the semiconductor memory device according to certain embodiments of the inventive concept.

FIG. 21 is a block diagram illustrating still another embodiment of a computer system 4300 including the semiconductor memory device according to certain embodiments of the inventive concept.

The computer system 4300 of FIG. 21 may be implemented as an image processing device such as a digital camera, a mobile phone, a smart phone or a tablet including a digital camera.

The computer system 4300 may include a semiconductor memory device 4350, a memory controller 4310 that controls data processing operation including a write operation and a read operation of the semiconductor memory device 4350. Further, the computer system 4300 may include a CPU 4320, an image sensor 4330 and a display 4340.

The image sensor 4330 of the computer system 4300 converts an optical image to digital signals and transmits the converted digital signals to the CPU 4320 or the memory controller 4310. According to the control of the CPU 4320, the converted digital signals may be displayed through the display 4340 or stored in the semiconductor memory device 4350 through the memory controller 4310.

Further, the data stored in the semiconductor memory device 4350 may be displayed through the display 4340 according to the control of the CPU 4320 or the memory controller 4310. According to embodiments, the memory controller 4310 that can control an operation of the semiconductor memory device 4350 may be implemented as a part of the CPU 4320, or as a separate chip from the CPU 4320.

In the computer system 4300 of FIG. 21, the semiconductor memory device 4350 may include a bit-line sense amplifier such as disclosed herein.

The bit-line sense amplifier according to embodiments of the inventive concept may compensate mismatch of transistors included in the bit-line sense amplifier by adjusting an amount of a driving current supplied to a latch-type sense amplifier.

The inventive concept may be applied to a semiconductor device and a memory system including the same.

Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A bit-line sense amplifier, comprising:
   a pull-up driving circuit connected between a power supply voltage line and a first driving power supply line, and configured to provide a first driving current on the first driving power supply line in response to an up control signal;
   a pull-down driving circuit configured to provide a second driving current on a second driving power supply line in response to a down control signal; and a latch-type sense amplifier connected between the first driving power supply line and the second driving power supply line, and configured to sense and amplify a voltage difference between a bit line and a complementary bit line, wherein the pull-down driving circuit comprises:
a voltage adjusting circuit configured to regulate a power supply voltage on the power supply voltage line in response to a reference voltage to provide a first voltage on a first node;
a first driving circuit configured to generate a gate driving signal based on the down control signal and the first voltage; and
a second driving circuit configured to provide the second driving current on the second driving power supply line in response to the gate driving signal, and wherein the voltage adjusting circuit comprises:
a differential amplifier having an inverted input terminal to which the reference voltage is applied, and a non-inverted input terminal connected to the first node; and
a PMOS transistor having a gate connected to an output terminal of the differential amplifier, a source connected to the power supply voltage line, and a drain connected to the first node.

2. The bit-line sense amplifier of claim 1, wherein the latch-type sense amplifier comprises:
a first inverter including a first PMOS transistor and a first NMOS transistor, wherein a gate of each of the first PMOS transistor and the first NMOS transistor is connected to the complementary bit line; and
a second inverter including a second PMOS transistor and a second NMOS transistor, wherein a gate of each of the second PMOS transistor and the second NMOS transistor is connected to the bit line.

3. The bit-line sense amplifier of claim 2, wherein the latch-type sense amplifier is configured to output a threshold voltage of the first inverter as a voltage of the bit line, and to output a threshold voltage of the second inverter as a voltage of the complementary bit line.

4. The bit-line sense amplifier of claim 2, wherein the latch-type sense amplifier further comprises:
a first switch configured to electrically connect an output terminal of the first inverter to an input terminal of the first inverter in response to a first control signal;
a second switch configured to electrically connect an output terminal of the second inverter to an input terminal of the second inverter in response to the first control signal;
a third switch configured to electrically connect the output terminal of the first inverter to the bit line in response to a second control signal; and
a fourth switch configured to electrically connect the output terminal of the second inverter to the complementary bit line in response to the second control signal.

5. The bit-line sense amplifier of claim 2, wherein when the first driving current or the second driving current is changed, threshold voltages of the first PMOS transistor and the first NMOS transistor are changed.

6. The bit-line sense amplifier of claim 2, wherein when the first driving current or the second driving current is changed, threshold voltages of the second PMOS transistor and the second NMOS transistor are changed.

7. The bit-line sense amplifier of claim 1, wherein the pull-down driving circuit includes a plurality of NMOS transistors electrically connected between the second driving power supply line and a ground voltage line in response to bits of the down control signal, and
wherein an amount of the second driving current is configured to be changed according to the number of the NMOS transistors that are operated in response to bits of the down control signal.

8. The bit-line sense amplifier of claim 1, wherein the pull-down driving circuit includes a first driving circuit configured to generate a gate driving signal in response to the down control signal, and a second driving circuit configured to provide the second driving current on the second driving power supply line in response to the gate driving signal, and
wherein an amount of the second driving current is configured to be changed according to a voltage level of the gate driving signal.

9. The bit-line sense amplifier of claim 1, wherein a value of a logic high level of the gate driving signal is changeable based on the reference voltage, the power supply voltage, and the down control signal.

10. A bit-line sense amplifier, comprising:
a pull-up driving circuit connected between a power supply voltage line and a first driving power supply line, and configured to provide a first driving current on the first driving power supply line in response to an up control signal;
a pull-down driving circuit configured to provide a second driving current on a second driving power supply line in response to a gate driving signal and a down control signal; and
a latch-type sense amplifier connected between the first driving power supply line and the second driving power supply line, and configured to sense and amplify a voltage difference between a bit line and a complementary bit line,
wherein a voltage level of a logic high level of the gate driving signal is changeable based on a reference voltage, a power supply voltage on the power supply voltage line, and the down control signal.

11. The bit-line sense amplifier of claim 10, wherein the pull-up driving circuit includes a plurality of PMOS transistors connected between the power supply voltage line and the first driving power supply line, and
wherein the PMOS transistors are configured to operate in response to bits of the up control signal.

12. The bit-line sense amplifier of claim 10, wherein the pull-down driving circuit comprises:
a voltage adjusting circuit configured to regulate the power supply voltage in response to the reference voltage, and generate a first voltage on a first node;
a first driving circuit configured to generate the gate driving signal based on bits of the down control signal and the first voltage; and
a second driving circuit configured to provide the second driving current on the second driving power supply line in response to bits of the gate driving signal.

13. The bit-line sense amplifier of claim 12, wherein the voltage adjusting circuit comprises:
a differential amplifier having an inverted input terminal to which the reference voltage is applied, and a non-inverted input terminal connected to the first node; and
a PMOS transistor having a gate connected to an output terminal of the differential amplifier, a source connected to the power supply voltage line, and a drain connected to the first node.

14. The bit-line sense amplifier of claim 12, wherein the first driving circuit includes a plurality of inverters connected between the first node and a ground voltage line, and generates the bits of the gate driving signal in response to the bits of the down control signal.

15. A semiconductor memory device comprising:
    a first bit line and a second bit line; and
    a bit-line sense amplifier connected between the first bit line and the second bit line, the bit-line sense amplifier including:
        a pull-up driving circuit connected between a power supply voltage line and a first driving power line, and configured to provide a pull-up current on the first driving power line in response to a pull-up control signal;
        a pull-down driving circuit connected between a second driving power line and a ground voltage line, and configured to provide a pull-down current on the second driving power line in response to a first driving signal; and
        a latch-type sense amplifier connected between the first driving power line and the second driving power line, and configured to sense and amplify a voltage difference between the first bit line and the second bit line,
    wherein a value of a logic high level of the first driving signal is changeable based on a reference voltage.

16. The semiconductor memory device of claim 15, wherein the pull-down driving circuit comprises:
    a voltage adjusting circuit configured to regulate a power supply voltage on the power supply voltage line in response to the reference voltage to generate a first voltage on a first node;
    a first driving circuit configured to generate the first driving signal based on a down control signal and the first voltage; and
    a second driving circuit configured to generate the second driving current in response to the first driving signal.

17. The semiconductor memory device of claim 15, wherein the latch-type sense amplifier includes:
    a first inverter connected between the first power line and the second power line, and including an input terminal connected to the second bit line; and
    a second inverter connected between the first power line and the second power line, and including an input terminal connected to the first bit line.

18. The semiconductor memory device of claim 17, wherein the latch-type sense amplifier further includes:
    a first switch connected between an output terminal of the first inverter and the input terminal of the first inverter, and configured to turn on in response to a first control signal;
    a second switch connected between an output terminal of the second inverter and the input terminal of the second inverter, and configured to turn on in response to the first control signal;
    a third switch connected between the first bit line and the output terminal of the first inverter, and configured to turn on in response to a second control signal; and
    a fourth switch connected between the second bit line and the output terminal of the second inverter, and configured to turn-on in response to the second control signal.

19. The semiconductor memory device of claim 15, wherein the pull-up driving circuit includes a plurality of PMOS transistors configured to provide the pull-up current on the first power line in response to corresponding bits of the pull-up control signal.

* * * * *